(12) United States Patent
Lee et al.

(10) Patent No.: US 11,672,155 B2
(45) Date of Patent: *Jun. 6, 2023

(54) COLOR CONTROL ENCAPSULATION LAYER AND DISPLAY APPARATUS INCLUDING THE SAME

(71) Applicant: Samsung Electronics Co., Ltd., Suwon-si (KR)

(72) Inventors: Sunghun Lee, Hwaseong-si (KR); Byoungki Choi, Hwaseong-si (KR); Seungyeon Kwak, Suwon-si (KR); Jiwhan Kim, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/578,861

(22) Filed: Jan. 19, 2022

(65) Prior Publication Data
US 2022/0140009 A1 May 5, 2022

Related U.S. Application Data

(63) Continuation of application No. 16/855,294, filed on Apr. 22, 2020, now Pat. No. 11,271,050, which is a
(Continued)

(30) Foreign Application Priority Data

Nov. 21, 2017 (KR) .................. 10-2017-0155807

(51) Int. Cl.
H01L 27/32 (2006.01)
H01L 33/50 (2010.01)
(Continued)

(52) U.S. Cl.
CPC ........ *H01L 27/322* (2013.01); *H01L 27/3211* (2013.01); *H01L 27/3213* (2013.01);
(Continued)

(58) Field of Classification Search
CPC ..... H01L 33/50; H01L 33/502; H01L 33/504; H01L 51/5256; H01L 2251/5369;
(Continued)

(56) References Cited

U.S. PATENT DOCUMENTS 5,146,355 A 9/1992 Prince ............... G02F 1/133617
349/106
6,125,226 A 9/2000 Forrest ................ H01L 51/5271
313/504
(Continued)

FOREIGN PATENT DOCUMENTS

CN 105609656 A 5/2016
KR 100703524 B1 3/2007
(Continued)

OTHER PUBLICATIONS

Jones et al., "Barrier Films for Quantum Dot Encapsulation", Sep. 11, 2017, 1-10 [(http://www.aimcal.org/uploads/4/6/6/9/46695933/jones_abstract_barrier_films.pdf)].
(Continued)

*Primary Examiner* — Victoria K. Hall
(74) *Attorney, Agent, or Firm* — Cantor Colburn LLP

(57) ABSTRACT

A display apparatus includes an organic light-emitting device ("OLED") substrate which generates and emits a first light, and an encapsulation layer to which the emitted first light from the OLED substrate is incident and from which a second light is emitted. The encapsulation layer includes an inorganic material layer and an organic material layer alternately stacked with each other. The organic material layer includes a plurality of color control elements which color-
(Continued)

convert the emitted first light incident to the encapsulation layer. The plurality of color control elements may include a first and second color control element including a first and second quantum dot with which a color of the emitted first light incident to the encapsulation layer is converted to a first and second color, respectively.

12 Claims, 9 Drawing Sheets

Related U.S. Application Data continuation of application No. 16/152,905, filed on Oct. 5, 2018, now Pat. No. 10,686,019.

(51) Int. Cl.
　　*H01L 51/52* (2006.01)
　　*H01L 51/50* (2006.01)
(52) U.S. Cl.
　　CPC ........ *H01L 33/501* (2013.01); *H01L 51/5036* (2013.01); *H01L 51/5237* (2013.01); *H01L 27/3244* (2013.01); *H01L 51/5256* (2013.01); *H01L 51/5268* (2013.01); *H01L 2251/5369* (2013.01); *H01L 2251/558* (2013.01)
(58) Field of Classification Search
　　CPC ............. H01L 27/14621; H01L 27/322; H01L 27/3211; H01L 27/3213
　　See application file for complete search history.

(56) References Cited

U.S. PATENT DOCUMENTS

| | | | | |
|---|---|---|---|---|
| 7,342,620 | B2 | 3/2008 | Huh | G02B 5/201 |
| | | | | 349/106 |
| 9,064,822 | B2 | 6/2015 | Park et al. | |
| 9,239,458 | B2 | 1/2016 | Yoon | G02B 26/02 |
| 9,469,080 | B2 | 10/2016 | Hajjar | G02B 5/201 |
| 10,192,932 | B2 | 1/2019 | Steckel | H01L 51/502 |
| 10,228,586 | B2 | 3/2019 | Chae | H01L 27/322 |
| 10,304,813 | B2 | 5/2019 | Kuo | H01L 25/167 |
| 10,326,057 | B2 | 6/2019 | Kim | H01L 33/486 |
| 10,333,036 | B2 | 6/2019 | Ulmer | H01L 33/502 |
| 10,361,259 | B2 | 7/2019 | Choi | G09G 3/3233 |
| 10,396,132 | B2 | 8/2019 | Kim | H01L 51/502 |
| 10,490,709 | B2 | 11/2019 | Ko | H01L 33/52 |
| 10,686,019 | B2 * | 6/2020 | Lee | H01L 33/501 |
| 10,692,417 | B2 | 6/2020 | Lee | G09G 3/2003 |
| 11,004,910 | B2 | 5/2021 | Jung | H01L 51/0024 |
| 11,271,050 | B2 * | 3/2022 | Lee | H01L 51/5237 |
| 11,562,678 | B2 * | 1/2023 | Lee | H01L 51/5016 |
| 2006/0197437 | A1 | 9/2006 | Krummacher | B82Y 10/00 |
| | | | | 313/501 |
| 2007/0077349 | A1 * | 4/2007 | Newman | H01L 51/5212 |
| | | | | 427/256 |
| 2007/0182319 | A1 | 8/2007 | Wei | H01L 51/5262 |
| | | | | 313/506 |
| 2008/0169758 | A1 | 7/2008 | Cok | H01L 51/5262 |
| | | | | 313/506 |
| 2009/0244448 | A1 | 10/2009 | Chang | G02F 1/133514 |
| | | | | 349/106 |
| 2010/0156280 | A1 | 6/2010 | Song | H01L 51/5265 |
| | | | | 313/504 |
| 2012/0119239 | A1 | 5/2012 | Kim | H01L 25/048 |
| | | | | 257/89 |
| 2012/0313508 | A1 * | 12/2012 | Son | B32B 37/12 |
| | | | | 156/60 |
| 2013/0120981 | A1 | 5/2013 | Kim | F21V 9/08 |
| | | | | 362/231 |
| 2013/0335799 | A1 | 12/2013 | Yoon | G02F 1/133553 |
| | | | | 359/227 |
| 2014/0009723 | A1 | 1/2014 | Cho | H01J 9/205 |
| | | | | 349/65 |
| 2014/0145158 | A1 | 5/2014 | Choi | H01L 27/3246 |
| | | | | 257/40 |
| 2014/0183470 | A1 | 7/2014 | Kim | H01L 27/3276 |
| | | | | 257/40 |
| 2014/0183471 | A1 | 7/2014 | Heo | H01L 27/322 |
| | | | | 257/40 |
| 2014/0191204 | A1 | 7/2014 | Jeong | H01L 27/322 |
| | | | | 257/40 |
| 2014/0287543 | A1 | 9/2014 | Son | B32B 37/12 |
| | | | | 438/28 |
| 2014/0346473 | A1 | 11/2014 | Park | H01L 51/5256 |
| | | | | 257/40 |
| 2015/0085223 | A1 | 3/2015 | Park | G02F 1/133603 |
| | | | | 349/65 |
| 2015/0090971 | A1 | 4/2015 | Kim | H01L 51/5281 |
| | | | | 257/40 |
| 2015/0228697 | A1 | 8/2015 | Liu et al. | |
| 2015/0263252 | A1 * | 9/2015 | Wang | H01L 51/5262 |
| | | | | 257/98 |
| 2015/0280169 | A1 | 10/2015 | Choi | H01L 51/5237 |
| | | | | 257/72 |
| 2015/0293280 | A1 | 10/2015 | Lee | G02B 5/201 |
| | | | | 359/891 |
| 2015/0318506 | A1 | 11/2015 | Zhou et al. | |
| 2015/0340652 | A1 | 11/2015 | Oh | H01L 51/5256 |
| | | | | 257/40 |
| 2016/0005797 | A1 | 1/2016 | Huang | H01L 27/3209 |
| | | | | 257/40 |
| 2016/0072098 | A1 * | 3/2016 | Lee | H01L 27/3244 |
| | | | | 252/301.16 |
| 2016/0091757 | A1 | 3/2016 | Miki | G02F 1/133514 |
| | | | | 349/42 |
| 2016/0141338 | A1 * | 5/2016 | Li | H01L 51/504 |
| | | | | 257/40 |
| 2016/0195773 | A1 * | 7/2016 | Lee | G02F 1/133617 |
| | | | | 349/110 |
| 2017/0133357 | A1 | 5/2017 | Kuo | H01L 25/167 |
| 2017/0162756 | A1 | 6/2017 | Hartlove | B01J 13/08 |
| 2017/0170241 | A1 | 6/2017 | Huang | G02F 1/133512 |
| 2017/0179438 | A1 | 6/2017 | Xu | H01L 27/3213 |
| 2018/0019371 | A1 * | 1/2018 | Steckel | H01L 27/156 |
| 2018/0052366 | A1 | 2/2018 | Hao et al. | |
| 2018/0122836 | A1 | 5/2018 | Kang | H01L 33/08 |
| 2018/0156951 | A1 * | 6/2018 | Baek | G02F 1/133512 |
| 2018/0190747 | A1 | 7/2018 | Son | G06F 3/1446 |
| 2018/0233537 | A1 | 8/2018 | Liu | H01L 27/156 |
| 2019/0081122 | A1 | 3/2019 | Kim | H01L 27/3248 |
| 2019/0086740 | A1 * | 3/2019 | Bae | G02F 1/133345 |
| 2019/0121176 | A1 | 4/2019 | Lee | G02F 1/1336 |
| 2019/0137815 | A1 | 5/2019 | Kim | G02F 1/136286 |
| 2019/0148458 | A1 | 5/2019 | Kim | H01L 51/502 |
| | | | | 257/89 |
| 2019/0165318 | A1 | 5/2019 | Choi | H01L 51/56 |
| 2019/0179065 | A1 | 6/2019 | Kim | H01L 27/322 |
| 2019/0237618 | A1 | 8/2019 | Zou | H01L 25/0753 |
| 2019/0252579 | A1 | 8/2019 | Choi | H01L 25/0753 |
| 2019/0295996 | A1 | 9/2019 | Park | H01L 27/15 |
| 2019/0378873 | A1 | 12/2019 | Lee | H01L 25/0655 |
| 2020/0027928 | A1 | 1/2020 | Wu | H01L 51/5284 |
| 2020/0251040 | A1 | 8/2020 | Lee | H01L 27/322 |

FOREIGN PATENT DOCUMENTS

| | | |
|---|---|---|
| KR | 1020140086270 A | 7/2014 |
| KR | 1020160000811 A | 1/2016 |
| KR | 1020160046202 A | 4/2016 |
| KR | 1020170096583 A | 8/2017 |

OTHER PUBLICATIONS

Wang et al., "Enhanced moisture barrier performance for ALD-encapsulated OLEDs by introducing an organic protecive layer*", Journal of Materials Chemistry C, vol. 5, 2017, 4107-4024 (http://

(56) References Cited

OTHER PUBLICATIONS pubs.rsc.org/en/content/articlelanding/2017/tc/c7tc00903h#!divAbstract).
Coe-Sullivan et al., "Tuning the performance of hybrid organic/inorganic quantum dot light-emitting devices", Org.Electron., vol. 4, Issue 2-3 pp. 123-130 (https://onelab.mit.edu/tuning-performance-hybrid-organicinorganic-quantum-dot-light-emitting-devices), (Note: Abstract only provided.
KR Korean Office Action for Korean Patent Application No. 10-2017-0155807 dated Mar. 16, 2022.

* cited by examiner

Absorption type CF

Cut-off filter type

COLOR CONTROL ENCAPSULATION LAYER AND DISPLAY APPARATUS INCLUDING THE SAME

CROSS-REFERENCE TO RELATED APPLICATION

This application is a continuation application of U.S. application Ser. No. 16/855,294 filed Apr. 22, 2020 and issued as U.S. Pat. No. 11,271,050 on Mar. 8, 2022, which is a continuation application of U.S. application Ser. No. 16/152,905 filed Oct. 5, 2018 and issued as U.S. Pat. No. 10,686,019 on Jun. 16, 2020, which claims priority to Korean Patent Application No. 10-2017-0155807, filed on Nov. 21, 2017, and all the benefits accruing therefrom under 35 U.S.C. § 119, the disclosure of which is incorporated herein in its entirety by reference.

BACKGROUND

1. Field

Embodiments set forth herein relate to display apparatuses.

2. Description of the Related Art

Organic light-emitting devices ("OLED") are self-light-emitting type devices having a wide viewing angle, excellent contrast, high response speed, superior characteristics in terms of a driving voltage, luminance, etc. and being capable of generating multiple colors.

An OLED may include an anode, a cathode, and an emission layer (an organic material-including emission layer) interposed between the anode and the cathode. A hole transport region may be located between the anode and the emission layer. An electron transport region may be located between the emission layer and the cathode. Holes injected from the anode may move to the emission layer via the hole transport region. Electrons injected from the cathode may move to the emission layer via the electron transport region. Carriers such as holes and electrons may recombine in the emission layer to produce excitons. Light may be generated as the excitons change from an excited state to a ground state.

Hybrid technologies of applying quantum-dot materials to organic light-emitting device ("OLED") type displays have drawn attention. Quantum dots are nanometer-sized semiconductor crystals. An energy gap of quantum dots may be controlled according to a size and shape of the quantum dots. When a semiconductor material is reduced to a size of nanometers like the quantum dot, unique optical characteristics may be generated due to a quantum mechanics phenomenon. Particularly, the quantum dots have high luminous efficiency and a narrow full width at half maximum ("FWHM") in a visible-light region, and thus are expected to be a next-generation display material.

SUMMARY

Provided are display apparatuses which have excellent encapsulation properties with regard to an external environment and which may be relatively easily manufactured.

Provided are display apparatuses capable of suppressing color blurring or color mixing.

Provided are display apparatuses in which color conversion elements are applied in an encapsulation layer structure.

Provided are methods of manufacturing the display apparatuses.

Additional features will be set forth in part in the description which follows and, in part, will be apparent from the description, or may be learned by practice of the presented embodiments.

According to an embodiment, a display apparatus includes an organic light-emitting device ("OLED") substrate which generates and emits a first light, and an encapsulation layer to which the emitted first light from the organic light-emitting device substrate is incident and from which a second light is emitted, the encapsulation layer including an inorganic material layer and an organic material layer alternately stacked with each other. The organic material layer of the encapsulation layer includes a plurality of color control elements which color-convert the emitted first light incident to the encapsulation layer. The plurality of color control elements include a first color control element including a first quantum dot with which a color of the emitted first light incident to the encapsulation layer is converted to a first color, and a second color control element including a second quantum dot with which the color of the emitted first light incident to the encapsulation layer is converted to a second color.

The encapsulation layer may further include a first inorganic material layer, a second inorganic material layer and the organic material layer including the plurality of color control elements between the first and second inorganic material layers.

The first quantum dot of the first color control element may convert the color of the emitted first light incident to the encapsulation layer into red, and the second quantum dot of the second color control element may convert the color of the emitted first light incident to the encapsulation layer into green.

The organic material layer may further include a light-scattering element adjacent along the organic light-emitting device substrate to the plurality of color control elements. The light-scattering element may maintain the color of the emitted first light incident to the encapsulation layer.

The plurality of color control elements may further include a third color control element adjacent along the organic light-emitting device substrate to the first and second color control elements, the third color control element, the third color control element including a third quantum dot with which the color of the emitted first light incident to the encapsulation layer is converted to a third color.

The display apparatus may further include a color filter layer to which the emitted second light from the encapsulation layer is incident.

The display apparatus may further include a plurality of sub-pixel regions at which color light is emitted to display an image. The color filter layer may include respectively corresponding to the plurality of sub-pixel regions: a first color filter which corresponds to the first color control element of the encapsulation layer, a second color filter which corresponds to the second color control element of the encapsulation layer, and a third color filter.

Within the color filter layer to which the emitted second light from the encapsulation layer is incident, the first color filter may be a first cut-off filter which selectively transmits light in a red light wavelength region. The second color filter may be a second cut-off filter which selectively transmits light in a green light wavelength region. The third color filter may be a third cut-off filter which selectively transmits light in a blue light wavelength region.

Within the color filter layer to which the emitted second light from the encapsulation layer is incident, the first color filter may be an absorption type red color filter. The second color filter may be an absorption-type green color filter. The third color filter may be an absorption-type blue color filter.

The OLED substrate may include a first electrode, a second electrode, and an organic emission layer between the first and second electrodes. The first and second electrodes may be electrically separated from the inorganic material layer of the encapsulation layer.

The organic material layer of the encapsulation layer may include a photocurable organic material and a light-scattering agent.

The organic material layer of the encapsulation layer may have a thickness of about 10 nanometers (nm) to about 10000 nm.

The inorganic material layer of the encapsulation layer may include any one of a metal nitride, a metal oxide, a metal oxynitride, a metal carbide and a combination thereof.

The inorganic material layer of the encapsulation layer may be an insulating layer or a semiconductor layer.

The inorganic material layer of the encapsulation layer may have a thickness of about 10 nm to about 5000 nm.

Within the encapsulation layer, the first and second inorganic material layers may each extend along the organic material layer to dispose ends of the first and second inorganic material layers spaced apart from outer sides of the organic material layer, the first and second inorganic material layers being bonded to each other at the ends thereof.

The OLED substrate may be a blue OLED substrate which emits blue first light, a white OLED substrate which emits white first light, or a cyan OLED substrate which emits cyan first light.

The display apparatus may further include a thin-film transistor ("TFT") array substrate connected to the OLED substrate to drive the substrate. The TFT array substrate may include a plurality of TFTs connected to pixel regions of the OLED substrate to drive the pixel regions of the substrate.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
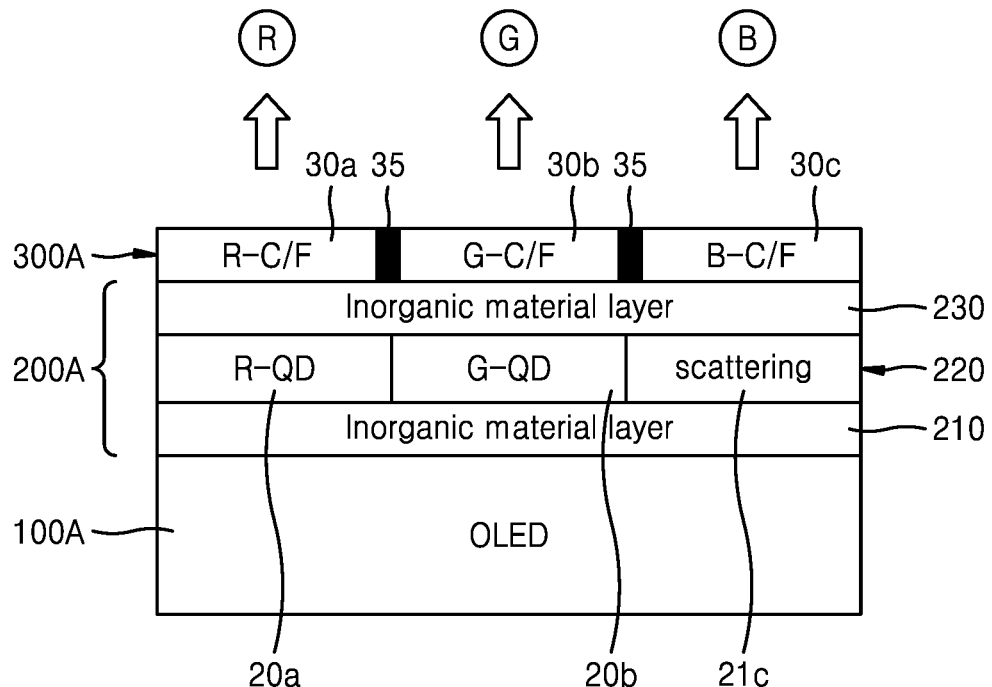
FIG. 1 is a cross-sectional view of a display apparatus according to an embodiment.

Various example embodiments will now be described more fully with reference to the accompanying drawings in which example embodiments are shown.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present.

As used herein the term "and/or" includes any and all combinations of one or more of the associated listed items. Expressions such as "at least one of," when preceding a list of elements, modify the entire list of elements and do not modify the individual elements of the list. "At least one" is not to be construed as limiting "a" or "an." "Or" means "and/or."

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, display apparatuses according to embodiments will be described in detail with reference to the accompanying drawings. In the drawings, a width and thickness of each layer or region may be exaggerated for clarity and convenience of explanation. Throughout the detailed description, same reference numerals represent same elements.

FIG. 1 is a cross-sectional view of a display apparatus according to an embodiment.

Referring to FIG. 1, an organic light-emitting device ("OLED") substrate 100A may be provided. A multi-layer encapsulation layer 200A may be located on the OLED substrate 100A.

The display apparatus and elements thereof may be disposed along first and second directions which cross each other. In FIG. 1, for example, the horizontal direction may represent the first and/or the second direction. A thickness of the display apparatus and element thereof is taken along a third direction which crosses each of the first and second directions. In FIG. 1, for example, the vertical direction represents the thickness (e.g., third) direction. A top or front of the display apparatus may be defined at a side thereof at which light is emitted.

The OLED substrate 100A may be a light-source OLED. The OLED substrate 100A may include a first electrode, a second electrode, and an organic emission layer between the first and second electrodes. The first electrode may be an anode and the second electrode may be a cathode, or vice versa. The OLED substrate 100A may further include an electron transport layer and a hole transport layer, and may additionally include a hole injection layer and an electron injection layer.

The OLED substrate 100A may be, for example, a blue-OLED substrate emitting blue light, a white-OLED substrate emitting white light, or a cyan-OLED substrate emitting cyan light. However, colors of light emitted from the OLED substrate 100A are not limited thereto and are variable. In the following description with reference to FIG. 1, the OLED substrate 100A is a blue-OLED substrate but is merely an example. In an embodiment of manufacturing the OLED substrate 100A, the OLED substrate 100A may be formed using an open mask process such that the OLED substrate 100A has the same structure (a uniform structure) at all locations when viewed from a top view (e.g., along the thickness direction from the top or front), but the open mask process may not be used according to circumstances.

The encapsulation layer 200A may have a structure in which an inorganic material layer and an organic material layer are alternately stacked with each other at least once. At least one organic material layer of the encapsulation layer 200A may include color control elements including quantum dots ("QDs"). When one inorganic material layer and one organic material layer together form one encapsulation unit, 'n' number of encapsulation units may be provided. Here, 'n' may be greater than or equal to 1.

Referring to FIG. 1, for example, the encapsulation layer 200A may have a structure in which a first inorganic material layer 210, an organic material layer 220 and a second inorganic material layer 230 are sequentially stacked along the thickness direction of the display apparatus.

The organic material layer 220 may include a plurality of color control elements 20a and 20b to control a color of light generated by the OLED substrate 100A. The color control elements 20a and 20b may include a first color control element 20a including a first QD to realize a first color, and a second color control element 20b including a second QD to realize a second color. The second color may be different from the first color.

The organic material layer 220 may further include a light-scattering element 21c located at a side (lateral side) of the color control elements 20a and 20b, such as along the first and/or second direction. The light-scattering element 21c may be a region that does not include a QD, e.g., a non-QD-including region. That is, the light-scattering element 21c maintains the color of the light emitted from the OLED substrate 100A and incident to the encapsulation layer 200A. The organic material layer 220 including the color control elements 20a and 20b to which QDs are applied may be sandwiched between the two inorganic material layers 210 and 230. Thus, a lowermost layer and an uppermost layer of the encapsulation layer 200A may be respectively the inorganic material layers 210 and 230. The light-scattering element 21c may be provided in plurality within the display apparatus. The color control elements 20a and 20b and the light-scattering element 21c within a same organic material layer 220 are disposed at substantially a same distance as each other from the OLED substrate 100A along the thickness direction of the display apparatus.

The encapsulation layer 200A may encapsulate the color control elements 20a and 20b therein while encapsulating the OLED substrate 100A thereunder. Furthermore, the encapsulation layer 200A may have a color control function since the color control elements 20a and 20b are included therein.

The first color control element 20a may be a red-QD-including layer and may convert a color of light generated by the OLED substrate 100A into light having a red (R) color. The second color control element 20b may be a green-QD-including layer and may convert a color of light generated by the OLED substrate 100A into light having a green (G) color. Thus, the first color control element 20a may be referred to as a first color converter (or color conversion element), and the second color control element 20b may be referred to as a second color conversion element. In an embodiment of manufacturing the encapsulation layer 200A, the color conversion elements may be formed by combining a photocurable organic material, certain QDs and a light-scattering agent. The photocurable organic material may include, for example, a resin material such as a photoresist ("PR") material.

The light-scattering element 21c may scatter light without changing the color of light generated by the OLED substrate 100A. Since each of the first and second color control elements 20a and 20b may include a light-scattering agent, the light-scattering element 21c may be provided at a side of the first and second color control elements 20a and 20b to achieve color balance. The light-scattering element 21c may include a photocurable organic material and a light-scattering agent. Here, the photocurable organic material may include a photoresist ("PR") material, and the light-scattering agent may include, for example, titanium oxide ($TiO_2$) or the like but embodiments are not limited thereto.

The first QD included in the first color control element 20a may be a red QD. The second QD included in the second color control element 20b may be a green QD. Each of the QDs may be a semiconductor particle having a nanometer (nm) sized spherical shape or a shape similar thereto and having a size (e.g., diameter) of about several to several tens of nanometers.

The QD may have a monolithic structure or a core-shell structure. When the QD has the core-shell structure, the QD may have a single-shell structure of a multi-shell structure. In an embodiment, for example, the QD may consist of a core portion (e.g., center portion) including or formed of a first semiconductor and a skin portion (e.g., shell portion) including or formed of a second semiconductor. Here, a material of the core portion (e.g., center portion) may be cadmium selenide (CdSe), cadmium telluride (CdTe), cadmium sulfide (CdS), or the like. A material of the skin portion (e.g., shell portion) may be zinc sulfide (ZnS) or the like. Alternatively, a material of the skin portion (e.g., shell portion) may be a cadmium-free based QD. That is, various materials that do not include cadmium (Cd) may be applied to the QD. However, the above-described materials are merely examples and other various materials may be applied to the QD. In embodiments, for example, the QD may include at least one among a Group II-VI-based semiconductor, a Group III-V-based semiconductor, a Group IV-VI-based semiconductor, and a Group IV-based semiconductor.

The QD has a relatively very small size and may thus exhibit the quantum confinement effect. When a size of a particle is relatively very small, electrons in the particle form a discontinuous energy state due to the outer walls of the particle. As the size of an inner space of the particle decreases, an energy state of the electrons relatively increases and energy band intervals increases. This effect refers to the quantum confinement effect. Due to the quantum confinement effect, when light such as an ultraviolet ray or visible light is incident on the QD, light of various wavelength ranges may be generated.

A wavelength of light generated by the QD may be determined by a size, material and/or structure of the QD. In detail, when light of a wavelength having energy higher than an energy band interval is incident on the QD, the QD absorbs the energy of the light and is thus excited, emits light of a specific wavelength, and changes to a ground state. In this case, when the size of the QD (or the core portion of the QD) is relatively small, light of a relatively short wavelength, e.g., blue or green light, may be generated. When the size of the QD (or the core portion of the QD) is relatively large, light of a relatively long wavelength, e.g., red light, may be generated. Accordingly, light of various colors may be achieved according to the size of the QD (or the core portion of the QD).

A QD particle emitting green light may be referred to as a green-light QD particle (e.g., a green QD particle). A QD particle emitting red light may be referred to as a red-light QD particle (e.g., a red QD particle). In an embodiment, for example, the green-light QD particle (or core portion) may be a particle having a width (e.g., diameter) of about 2 nm to about 3 nm, and the red-light QD particle (or core portion) may be a particle having a width (e.g., diameter) of about 5 nm to about 6 nm. A wavelength of emitted light may be controlled according to a material and structure of the QD, as well as the size (e.g., diameter) of the QD.

A color filter layer 300A may be further provided on the encapsulation layer 200A. An upper surface of the color filter layer 300A may define a light emitting surface of the display apparatus without being limited thereto. The color filter layer 300A may include first, second and third color filters 30a, 30b and 30c respectively corresponding to a plurality of sub-pixel regions of the display apparatus at which color light is emitted such as to display an image. The first color filter 30a may correspond to the first color control element 20a. The second color filter 30b may correspond to the second color control element 20b. The third color filter 30c may correspond to the light-scattering element 21c.

The first, second and third color filters 30a, 30b and 30c may be absorption type color filters including pigment or dye. The first color filter 30a may be an absorption type red-color filter (C/F). The second color filter 30b may be an absorption type green-color filter (C/F). The third color filter 30c may be an absorption type blue-color filter (C/F). The red-color filter 30a may selectively transmit light of a red wavelength region and absorb light of the other wavelength regions. The green-color filter 30b may selectively transmit light of a green wavelength region and absorb light of the other wavelength regions. The blue-color filter 30c may selectively transmit light of a blue wavelength region and absorb light of the other wavelength regions. By such transmitting and absorbing described above, the first color filter 30a may filter out undesired light among light incident thereto after passing through the first color control element 20a. Similarly, the second color filter 30b may filter out undesired light among light incident thereto after passing through the second color control element 20b and the third color filter 30c may filter out undesired light among light incident thereto after passing through the light-scattering element 21c. Full RGB colors may be achieved using the color control elements 20a and 20b and the color filter layer 300A. Here, the above-described order or method of the arrangement of RGB sub-pixels are merely an example and may be changed variously.

In the color filter layer 300A, partitions 35 may be respectively provided between the first color filter 30a and the second color filter 30b and between the second color filter 30b and the third color filter 30c. The partitions 35 may be a type of black matrices. In an embodiment of manufacturing the color filter layer 300A, after the partitions 35 are formed, the first to third color filters 30a, 30b, and 30c may be formed in regions defined by the partitions 35. The partitions 35 may reduce or effectively prevent different colors of light emitted at pixels or sub-pixels from being mixed with each other.

The inorganic material layers 210 and 230 of the encapsulation layer 200A may include a metal nitride, a metal oxide, a metal oxynitride, a metal carbide, or a combination thereof. In an embodiment, for example, the inorganic material layers 210 and 230 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, or a combination thereof. The inorganic material layers 210 and 230 may be insulating layers or semiconductor layers. The inorganic material layers 210 and 230 may each have a thickness of about 10 nm to about 5000 nm, for example, a thickness of about 50 nm to about 1000 nm, along the thickness direction of the display apparatus. The thickness may be a total thickness and/or maximum thickness of such layer(s). When the thickness of each of the inorganic material layers 210 and 230 satisfies the above-described thickness range, the encapsulation layer 200A may have a relatively high sealing property to reduce or effectively prevent contamination (e.g., moisture, etc.) from reaching other elements of the encapsulation layer 200A. However, the material and thickness range of the inorganic material layers 210 and 230 are not limited thereto.

The organic material layer 220 of the encapsulation layer 200A may include a photocurable organic material. The photocurable organic material may include a photoresist ("PR") material. The organic material layer 220 may include a titanium oxide ($TiO_2$) or the like as a light-scattering agent. The organic material layer 220 may planarize a step portion (not shown) formed due to a pixel defining layer of the OLED substrate 100A and/or may lessen stress caused by the inorganic material layer 210 or 230. As a basic function, the organic material layer 220 includes the color control elements 20a and 20b and may thus have a color control function. The organic material layer 220 may have a thickness of about 10 nm to about 10000 nm, for example, a thickness of about 1000 nm to about 10000 nm. The thickness may be a total thickness and/or maximum thickness of such layer(s). Accordingly, the organic material layer 220 may have a thickness greater than those of the inorganic material layers 210 and 230. When the thickness of the organic material layer 220 satisfies the above-described thickness range, a planarizing process may be effectively performed using the organic material layer 220. However, the material and thickness range of the organic material layer 220 are not limited thereto. When there are two or more organic material layers 220, the thicknesses thereof may be the same or different. In an embodiment of manufacturing the encapsulation layer 200A, the organic material layer 220 may be easily formed using a printing process, a photolithographic process, or the like.

In another embodiment, a cut-off filter type color filter may be used instead of one or more of the absorption type color filters 30a, 30b and 30c of FIG. 1. Examples of the cut-off filter type color filters are illustrated in FIG. 2.

Figure 2:
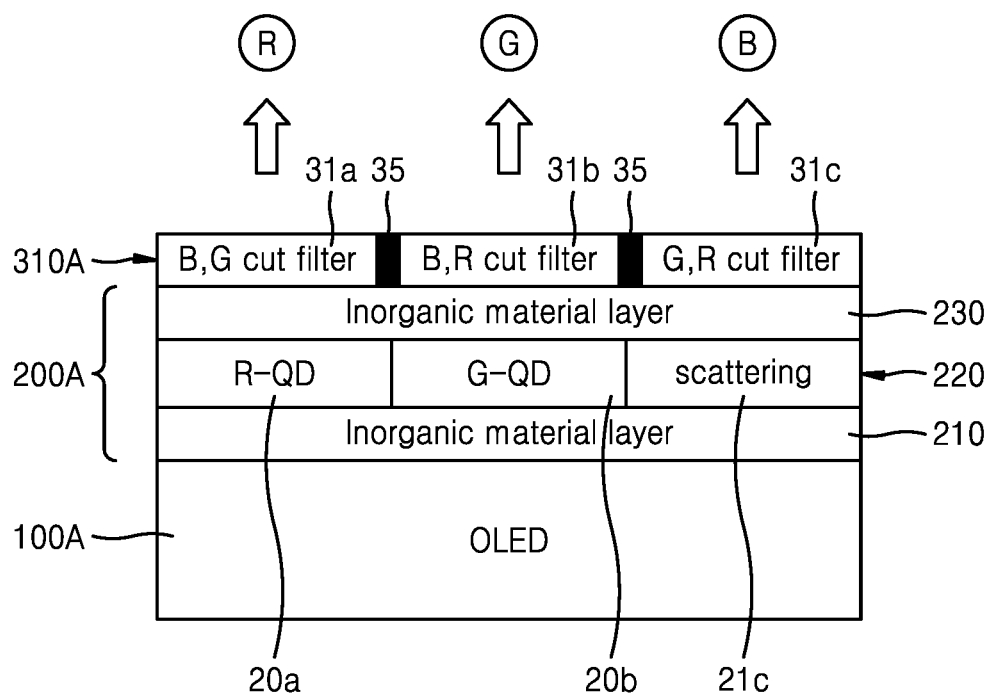
FIG. 2 is a cross-sectional view of a display apparatus according to another embodiment.

Referring to FIG. 2, a color filter layer 310A may include cut-off filter type first to third color filters 31a, 31b and 31c. The first color filter 31a may filter out light of a blue wavelength region and light of a green wavelength region among light incident thereto after passing through a first color control element 20a. The second color filter 31b may filter out light of a blue wavelength region and light of a red wavelength region among light incident thereto after passing through a second color control element 20b. The third color filter 31c may filter out light of a green wavelength region and light of a red wavelength region among light incident thereto after passing through a light-scattering element 21c. The first color filter 31a may be referred to as a blue-and-green-cut filter (B,G cut filter). The second color filter 31b may be referred to as a blue-and-red-cut filter (B,R cut filter). The third color filter 31c may be referred to as a green-and-red-cut filter (G,R cut filter). In other words, the first color filter 31a may be a first cut-off filter configured to selectively transmit light of a red wavelength region. The second color filter 31b may be a second cut-off filter configured to selectively transmit light of a green wavelength region. The third color filter 31c may be a third cut-off filter configured to selectively transmit light of a blue wavelength region. Color control/filtering characteristics of the display apparatus may be improved owing to the first to third color filters 31a, 31b and 31c.

The cut-off filter type color filters 31a, 31b and 31c may have, for example, a distributed Bragg reflector ("DBR") structure. The DBR structure may be manufactured by repeatedly stacking two material layers (e.g., dielectrics) having different refractive indexes from each other. The DBR structure may be manufactured to transmit or reflect only light of a desired wavelength band by controlling thicknesses of the material layers and a number of times of stacking the material layers, and is applicable to the color filters 31a, 31b and/or 31c. In an embodiment, for example, a $SiO_2$ layer and a $TiO_2$ layer may be repeatedly stacked to satisfy a condition of $\lambda/4$ (here, '$\lambda$' represents a wavelength of light), and a reflectance or transmittance of light of a desired wavelength band may be increased by controlling the thicknesses of these layers and a number of times of stacking the layers. The DBR structure is a well-known structure and is thus not described in detail here. At least one among the first to third color filters 31a, 31b and 31c may have a structure different from the DBR structure, e.g., a relatively high-contrast grating ("HCG") structure. In FIG. 2, components except the color filter layer 310A may be the same or substantially the same as those of FIG. 1.

In another embodiment, the display apparatus may further include a fourth sub-pixel region, as well as an R-sub-pixel (e.g., first sub-pixel) region, a G-sub-pixel (e.g., second sub-pixel) region and a B-sub-pixel (e.g., third sub-pixel)

region. The fourth sub-pixel region may be provided to exhibit a color (e.g., a fourth color) except for colors of red (R), green (G) and blue (B). The color (e.g., the fourth color) may be, for example, white (W) but is not limited thereto. Cases in which the fourth sub-pixel region is further provided are illustrated in FIGS. 3 and 4.

Figure 3:
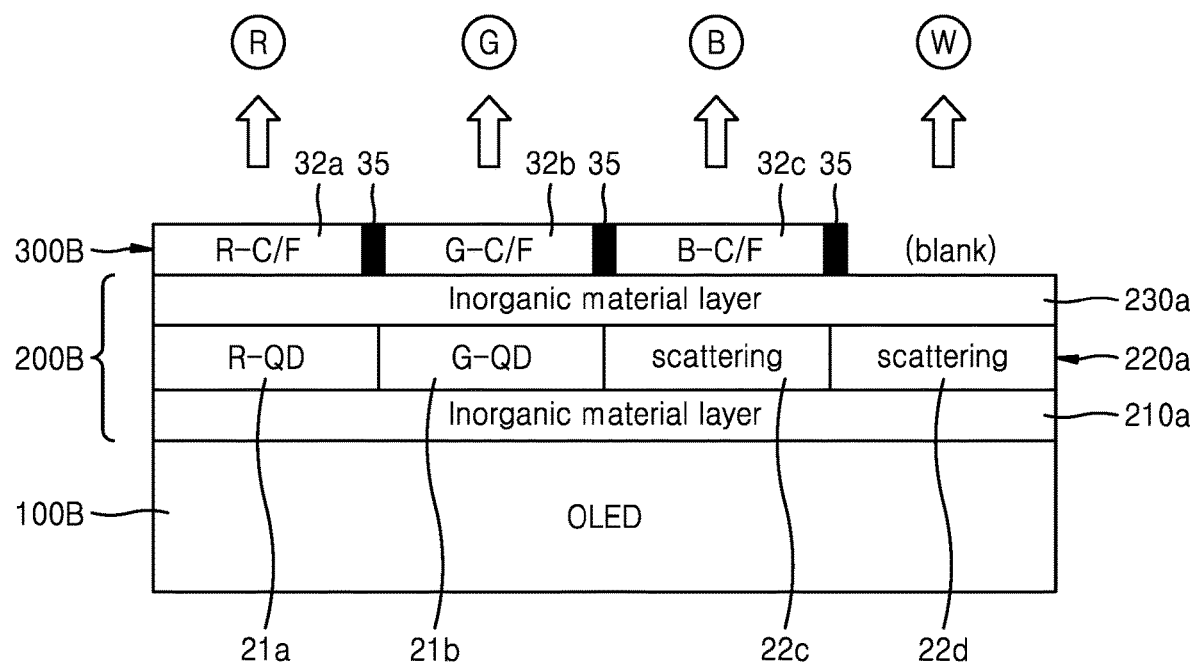
FIG. 3 is a cross-sectional view of a display apparatus according to another embodiment.

Referring to FIG. 3, similar to FIG. 1, an organic material layer 220a of an encapsulation layer 200B may include a first color control element 21a, a second color control element 21b, a first light-scattering element 22c and a second light-scattering element 22d. A first inorganic material layer 210a may be provided below the organic material layer 220a and a second inorganic material layer 230a may be provided on the organic material layer 220a. In this case, an OLED substrate 100B may be a white-OLED substrate which emits a white color light.

A color filter layer 300B may include first to third color filters 32a, 32b and 32c, and a blank region corresponding to the second light-scattering element 22d. The blank region may correspond to the fourth sub-pixel region described above, and white (W) color may be generated from the blank region. An upper surface of the color filter layer 300A at the first through third sub-pixel regions and an upper surface of the encapsulation layer 200B at the fourth sub-pixel region together may define a light emitting surface of the display apparatus without being limited thereto.

Figure 4:
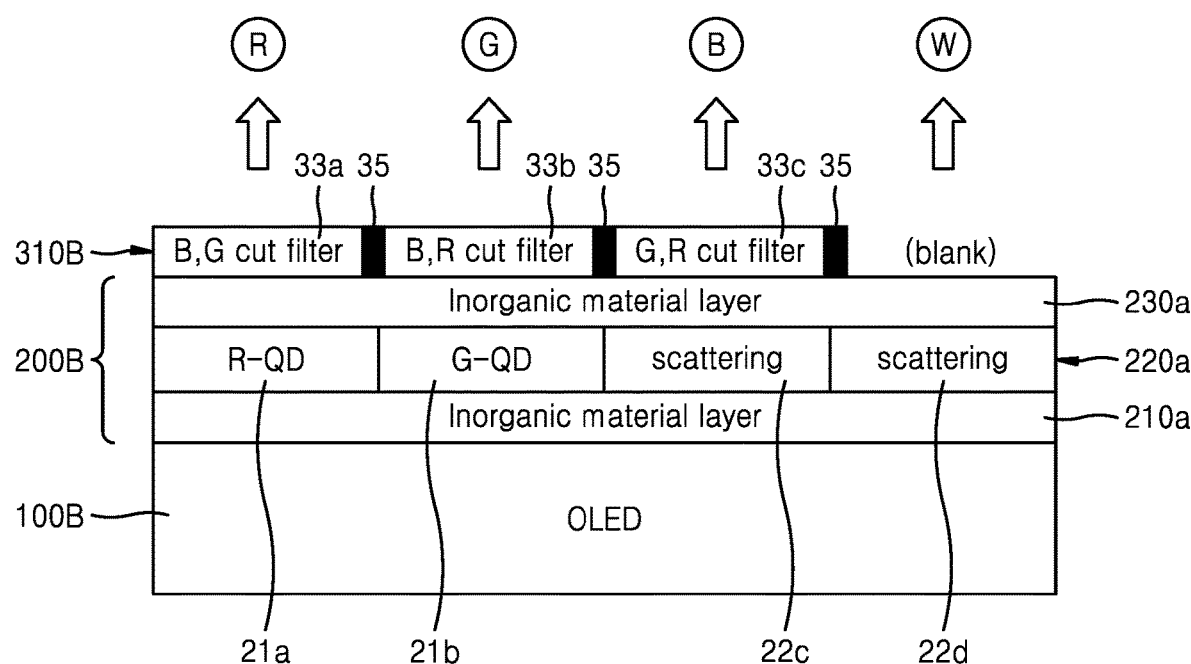
FIG. 4 is a cross-sectional view of a display apparatus according to another embodiment.

Referring to FIG. 4, similar to FIG. 3, a color filter layer 310B may include cut-off filter type color filters 33a, 33b and 33c. The color filter layer 310B may further include a blank region corresponding to the fourth sub-pixel region described above.

In another embodiment, a color conversion element including a QD (a blue QD) may be used instead of the light-scattering element 21c of FIG. 1. An example of the color conversion element is illustrated in FIG. 5.

Figure 5:
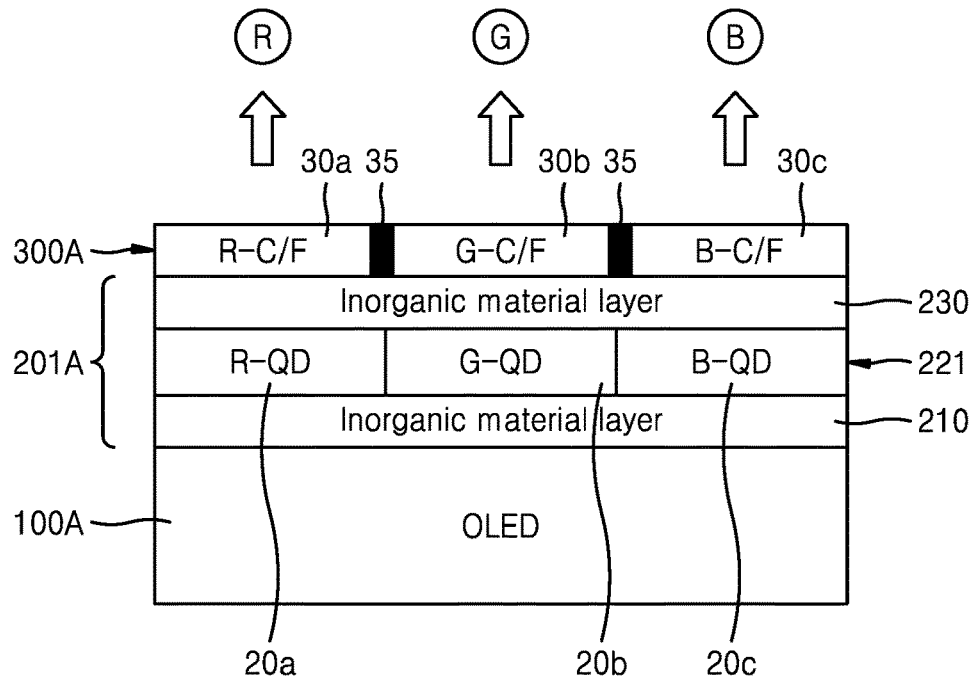
FIG. 5 is a cross-sectional view of a display apparatus according to another embodiment.

Referring to FIG. 5, an organic material layer 221 of an encapsulation layer 201A may include a third color control element 20c including a QD instead of the light-scattering element 21c of FIG. 1. The QD of the third color control element 20c may be a blue QD. Thus, the third color control element 20c may convert a color of light generated by an OLED substrate 100A into blue light. In this case, the OLED substrate 100A may be a light source generating light of color other than pure blue. The third color control element 20c including the blue QD may be used according to the type of the OLED substrate 100A. Although not shown, in the present embodiment, a fourth sub-pixel region may be further provided as shown in FIGS. 3 and 4. Although not shown, in the present embodiment, the cut-off filters 31a, 31b and 31c may be provided as shown in FIG. 2.

According to one or more embodiment of the present disclosure, a display apparatus which has relatively high protective (encapsulation) properties with respect to an external environment and which is relatively easy to manufacture may be provided. Furthermore, a display apparatus capable of suppressing and/or minimizing color blurring or color mixing may be provided.

In manufacturing a conventional display apparatus, since an outgassing phenomenon may occur during a process for forming a QD color conversion layer, in order to apply a QD color conversion layer to a top-emission light-emitting device, the QD color conversion layer may be directly formed by patterning on an OLED device (e.g., at a display portion thereof) encapsulated with a multi-layer thin film or may be formed on a separate glass substrate and thereafter bonded with an OLED device (e.g., at a display portion thereof). However, if the QD color conversion layer is directly formed by patterning on the OLED device (e.g., at the display portion thereof) encapsulated with the multi-layer thin film, a photoluminescence ("PL") property may be deteriorated when the QD color conversion layer is exposed to a general environment. Thus, the QD color conversion layer may be encapsulated by an additional encapsulation process. In this case, the OLED device is primarily encapsulated with a multi-layer thin film and is then secondarily encapsulated. Thus, the encapsulation process is relatively complicated. Furthermore, since the distance between the OLED device and the QD color conversion layer is relatively large, color implementation characteristics may be poor. If the QD color conversion layer is formed on the separate glass substrate and subsequently bonded with the OLED device (e.g., at the display portion thereof), two substrates are used and thus manufacturing costs may increase and a manufacturing process may be complicated. Furthermore, the distance between the OLED device and the QD color conversion layer may increase and thus color mixing may occur.

However, according to one or more embodiment of the present disclosure, at least one organic material film, e.g., among the organic material layers 220, 220a and 221, may be provided in the encapsulation layers 200A, 200B and 201A encapsulating the OLED substrates 100A and 100B, and the color control elements 20a, 20b, 20c, 21a and 21b including QDs may be disposed or formed in the organic material layers 220, 220a and 221. Accordingly, each of the OLED substrates 100A and 100B and the color control elements 20a, 20b, 20c, 21a and 21b may be encapsulated with one of the encapsulation layers 200A, 200B and 201A. Furthermore, since the distances between the OLED substrates 100A and 100B and the color control elements 20a, 20b, 20c, 21a and 21b are relatively small, color blurring may be suppressed or minimized. In addition, the distances between the color control elements 20a, 20b, 20c, 21a and 21b and the color filter layers 300A, 300B, 310A and 310B on the color control elements 20a, 20b, 20c, 21a and 21b may be maintained to a minimum. Thus, color mixing may be also suppressed or minimized. Accordingly, a display apparatus that has relatively high protective (encapsulation) characteristics, is easy to manufacture, and is capable of suppressing and/or minimizing color blurring or color mixing may be provided.

Figure 6:
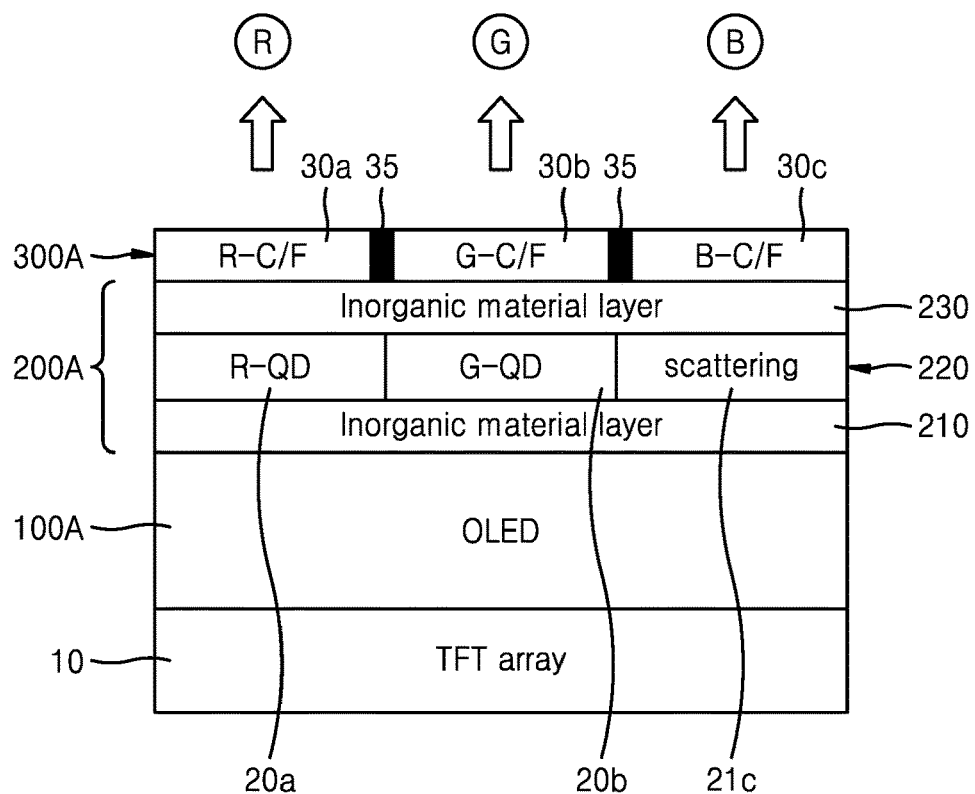
FIG. 6 is a cross-sectional view of a display apparatus according to another embodiment.

A display apparatus according to an embodiment may further include a thin-film transistor ("TFT") array substrate having a plurality of TFTs which drive pixel regions (or sub-pixel regions) of the OLED substrates 100A and 100B. An example of the display apparatus is illustrated in FIG. 6. FIG. 6 illustrates a case in which a TFT array substrate 10 is applied to the display apparatus of FIG. 1. However, it will be understood that the TFT array substrate 10 in FIG. 6 may be is applied to any one of the display apparatus disclosed in FIGS. 1 to 5.

Referring to FIG. 6, a TFT array substrate 10 having a plurality of TFTs (not shown) may be provided, and an OLED substrate 100A may be provided on the TFT array substrate 10. The plurality of TFTs of the TFT array substrate 10 may be devices configured to drive pixel regions (or sub-pixel regions) of the OLED substrate 100A. As such, the plurality of TFTs of the TFT array substrate 10 may be connected to the OLED substrate 100A and structures within the pixel regions (or sub-pixel region) to drive the pixel regions (or sub-pixel regions) of the OLED substrate 100A. The driving of the pixel regions (or sub-pixel regions) of the OLED substrate 100A may control the OLED substrate 100A to generate and/or emit light to be incident on an encapsulation layer 200A. The encapsulation layer 200A may be provided on the OLED substrate 100A to receive light emitted therefrom, and a color filter layer 300A may be provided on the encapsulation layer 200A to receive light emitted therefrom.

Figure 7:
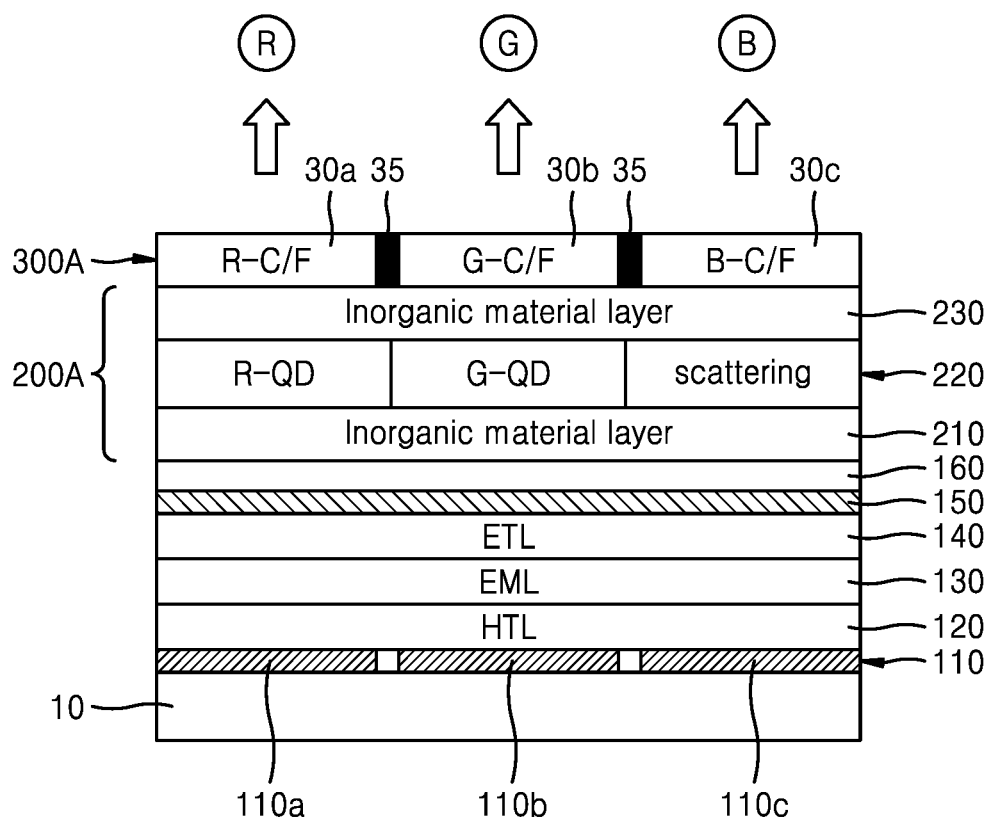
FIG. 7 is a detailed cross-sectional view of a structure of a display apparatus, according to an embodiment.

FIG. 7 is a detailed cross-sectional view of a structure of a display apparatus according to an embodiment.

Referring to FIG. 7, a TFT array substrate 10 may be provided, and a first electrode layer 110 having a plurality of first electrodes 110a, 110b and 110c may be provided on the TFT array substrate 10. The plurality of first electrodes 110a, 110b and 110c may be elements patterned to respectively correspond to sub-pixel regions. The plurality of first electrodes 110a, 110b and 110c may be electrically connected to TFT devices of the TFT array substrate 10. The plurality of first electrodes 110a, 110b and 110c may include or be formed of a transparent electrode material such as an indium tin oxide ("ITO").

An emission layer (EML) 130 including an organic material-based emission material may be provided on the first electrode layer 110. A hole transport layer (HTL) 120 may be provided between the EML 130 and the first electrode layer 110. An electron transport layer (ETL) 140 may be provided on the EML 130. A second electrode layer 150 may be provided on the ETL 140. Although not shown, a hole injection layer may be provided between the first electrode layer 110 and the HTL 120, and an electron injection layer may be provided between the second electrode layer 150 and the ETL 140. An intermediate material layer 160 may be further provided on the second electrode layer 150. The intermediate material layer 160 may be transparent and may be formed of an insulating material.

Although the first electrode layer 110 is patterned and the second electrode layer 150 has a non-patterned shape in the present embodiment, the second electrode layer 150 may be patterned into a plurality of electrode elements according to circumstances. Alternatively, the first electrode layer 110 may not be patterned and the second electrode layer 150 may be patterned, or both the first electrode layer 110 and the second electrode layer 150 may be patterned. Furthermore, the EML 130 located between the first electrode layer 110 and the second electrode layer 150 may be patterned into units corresponding to sub-pixels. In this case, all the HTL 120, the EML 130 and the ETL 140 may be patterned. Although a case in which one emission unit having the HTL 120, the EML 130 and the ETL 140 is used is illustrated and described above, a plurality of emission units may be used and a charge generation layer may be applied between the plurality of emission units. In other words, an OLED device having a tandem structure may be used. The collection of the first electrode layer 110, the HTL 120, the EML 130, the ETL 140, the second electrode layer 150 and the intermediate material layer may form a light-emitting substrate which generates and emits light therefrom. In embodiments, the light-emitting substrate illustrated in FIG. 6 may be used as the OLED substrate in any one of the display apparatus disclosed in FIGS. 1 to 6 without being limited thereto.

An encapsulation layer 200A and a color filter layer 300A according to an embodiment may be sequentially provided on the intermediate material layer 160. The first electrode layer 110 and the second electrode layer 150 of an OLED substrate may be electrically separated (e.g., disconnected) from an inorganic material layer 210 of the encapsulation layer 200A. The encapsulation layer 200A and the color filter layer 300A are as described above with reference to FIG. 1 and are thus not redundantly described again here.

Although FIG. 7 illustrates a case in which the TFT array substrate 10 is located below the emission layer 130, the TFT array substrate 10 may be located above the emission layer 130. In an embodiment, for example, the TFT array substrate 10 may be located between the EML 130 and the encapsulation layer 200A. In addition, components of the display apparatus described above with reference to FIG. 7 may be variously changed.

Figure 8:
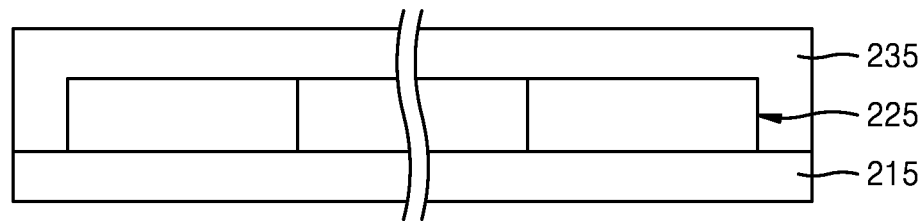
FIG. 8 is a cross-sectional view of a structure of an encapsulation layer applicable to a display apparatus, according to another embodiment.

FIG. 8 is a cross-sectional view of a structure of an encapsulation layer applicable to a display apparatus according to another embodiment.

Referring to FIG. 8, the encapsulation layer may include a first inorganic material layer 215, a second inorganic material layer 235, and a first organic material layer 225 located between the first inorganic material layer 215 and the second inorganic material layer 235. The first inorganic material layer 215 and the second inorganic material layer 235 may be larger in planar size than the first organic material layer 225 and may be bonded to each other at outer side edges of the first organic material layer 225. That is, the first inorganic material layer 215 and the second inorganic material layer 235 extend further than the side edges of the first organic material layer 225, to dispose ends of the first inorganic material layer 215 and the second inorganic material layer 235 spaced apart from the side edges of the first organic material layer 225. Thus, side surfaces of the first organic material layer 225 may be covered with the inorganic material layer 235. In other words, the first organic material layer 225 may be completely sealed by the first inorganic material layer 215 and the second inorganic material layer 235.

The first organic material layer 225 may be divided into a plurality of sub-pixel regions, and include color conversion elements including QDs. When the first organic material layer 225 is completely sealed by the inorganic material layers 215 and 235 according to the present embodiment, the protective (e.g., encapsulation) characteristic of the first organic material layer 225 may be more enhanced. That is, permeation of external oxygen or moisture may be reduced or effectively prevented due to the inorganic material layers 215 and 235 sealing the first organic material layer 225 therebetween.

Figure 9:
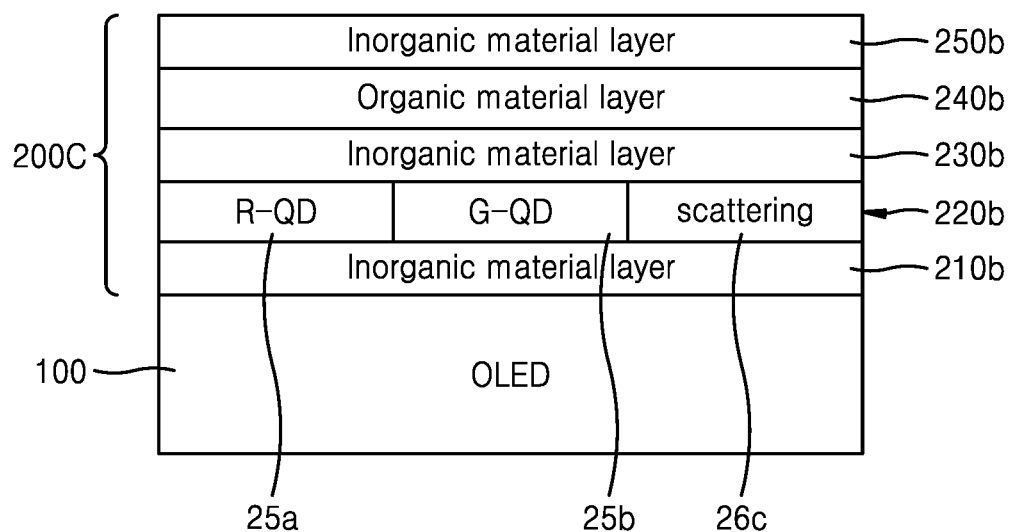
FIG. 9 is a cross-sectional view of a display apparatus according to another embodiment.

FIG. 9 is a cross-sectional view of a display apparatus according to another embodiment.

Referring to FIG. 9, an encapsulation layer 200C may be provided on an OLED substrate 100. The encapsulation layer 200C may have a structure in which one or more inorganic material layers and one or more organic material layers are alternately and repeatedly stacked, and a plurality of color control elements may be included in at least one of the one or more organic material layers. In an embodiment, for example, the encapsulation layer 200C may have a structure in which a first inorganic material layer 210b, a first organic material layer 220b, a second inorganic material layer 230b, a second organic material layer 240b and a third inorganic material layer 250b are sequentially stacked.

Color control elements 25a and 25b including QDs may be included in at least one of the first organic material layer 220b and the second organic material layer 240b, e.g., in the first organic material layer 220b. A light-scattering element 26c may be further included in the first organic material layer 220b. Here, the encapsulation layer 200C having a five-layer structure is illustrated as an example but the number of material layers of the encapsulation layer 200C may vary. Alternatively, the color control elements 25a and 25b and the light-scattering element 26c may be included in the second organic material layer 240b rather than the first organic material layer 220b. In embodiments, where more than one organic material layer is provided, the color control elements may be provided in only one organic material layer, without being limited thereto. In embodiments, where more than one organic material layer is provided, the light-scattering element 26c may be provided in a same organic material layer as the color control elements or in a different organic material layer from the color control elements.

Figure 10:
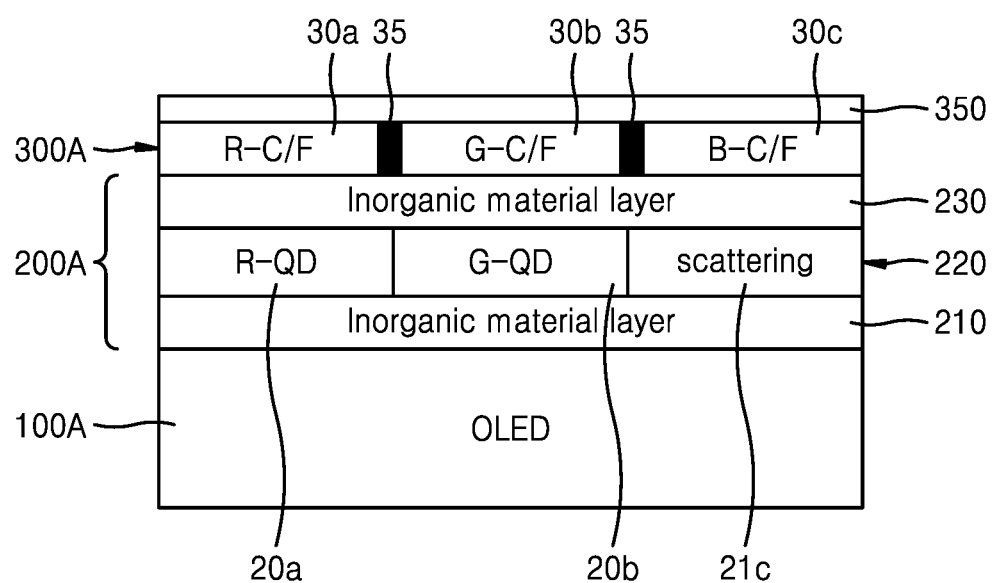
FIG. 10 is a cross-sectional view of a display apparatus according to another embodiment.

FIG. 10 is a cross-sectional view of a display apparatus according to another embodiment. FIG. 10 is a modified example of the display apparatus of FIG. 1.

Referring to FIG. 10, a cover layer 350 may be further provided on a color filter layer 300A. An encapsulation layer 200A may protect and encapsulate an OLED substrate 100A and an organic material layer 220, whereas the cover layer may protect the color filter layer 300A. An upper surface of the cover layer 350 may define a light emitting surface of the display apparatus without being limited thereto. The cover layer 350 may include or be formed of an inorganic material and may be a transparent insulating layer. When the color filter layer 300A includes or is formed of an inorganic material, the cover layer 350 may be omitted. The cover layer 350 is applicable to not only the display apparatus of FIG. 1 but also the display apparatuses of FIGS. 2 to 7.

Figure 11:
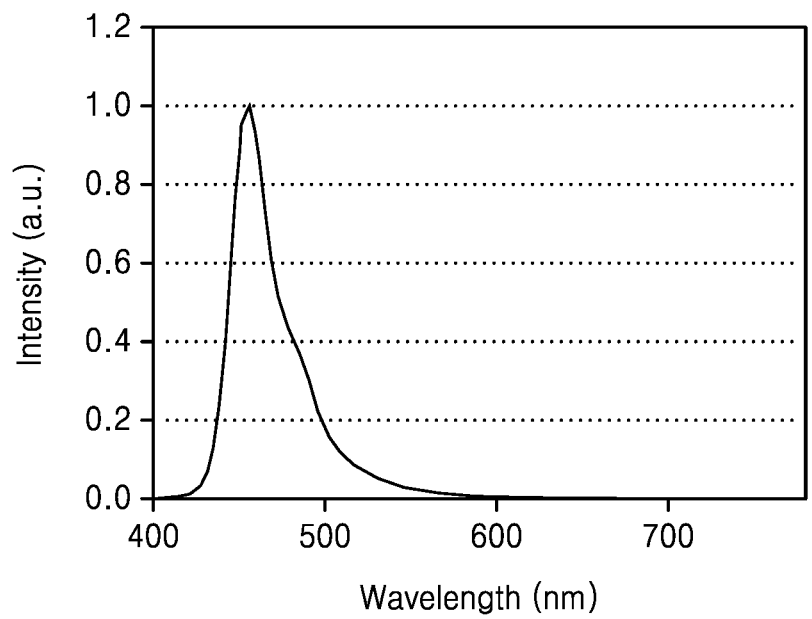
FIG. 11 is a graph showing an electroluminescence ("EL") spectrum of a blue organic light-emitting display device ("OLED") substrate applicable to a display apparatus according to an embodiment.

FIG. 11 is a graph showing an electroluminescence ("EL") spectrum of a blue-OLED substrate applicable to a display apparatus according to an embodiment. The EL spectrum is illustrated with an intensity in arbitrary units (a.u.) with respect to wavelength in nanometers (nm) for blue light.

Referring to FIG. 11, blue light is generated from the blue-OLED substrate. However, an OLED substrate applicable to a display apparatus according to an embodiment is not limited to the blue-OLED substrate, and may be various other colored OLED substrates such as a white-OLED substrate, a cyan-OLED substrate, or the like.

Figure 12:
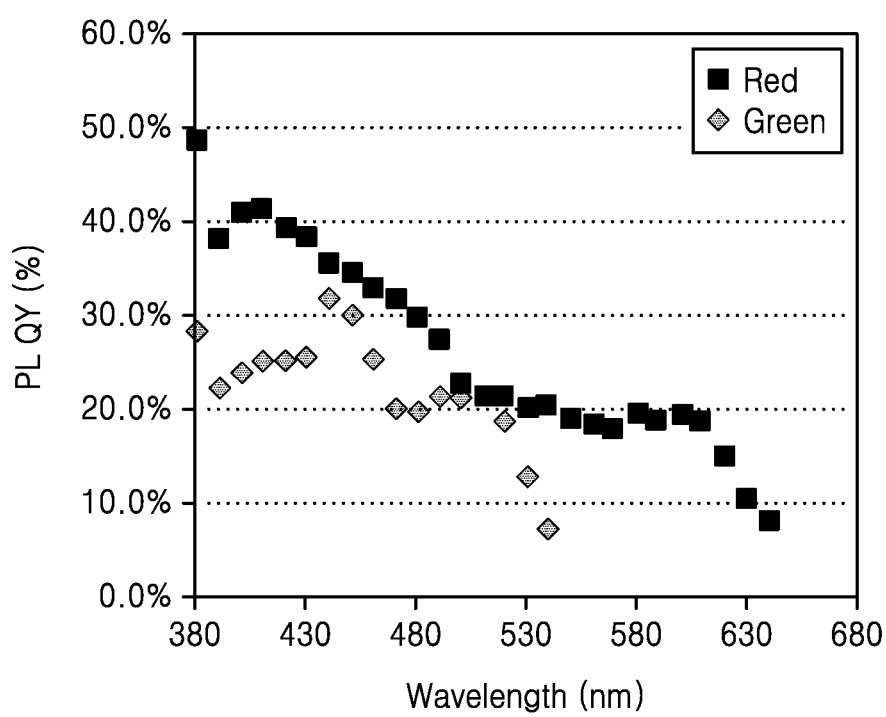
FIG. 12 is a graph showing photoluminescence ("PL") quantum yield (%) according to wavelengths of a color conversion element including a red quantum dot ("QD") and a color conversion element including a green QD, applicable to a display apparatus according to an embodiment.

FIG. 12 is a graph showing a photoluminescence ("PL") quantum yield ("QY") in percent (%) according to wavelengths in nanometers (nm) of a color conversion element including a red-QD and a color conversion element including a green-QD applicable to a display apparatus according to an embodiment.

Referring to FIG. 12, the color conversion element including the green-QD has a PL quantum yield up to approximately a green wavelength region, and the color conversion element including the red-QD has a PL quantum yield approximately until a red wavelength region. The color conversion element including the red-QD and color conversion element including the green-QD may be respectively applied to the first color control element 20a and the second color control element 20b of FIG. 1.

Figure 13:
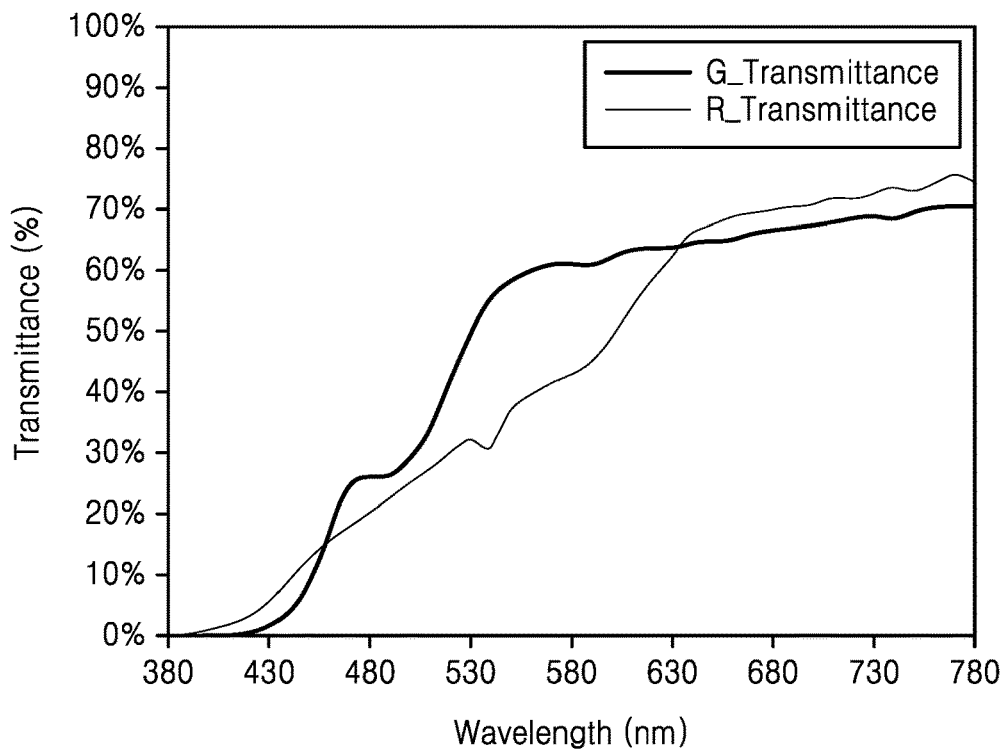
FIG. 13 is a graph showing a variation in transmittance (%) versus wavelengths of a color conversion element including a red QD and a color conversion element including a green QD, applicable to a display apparatus according to an embodiment.

FIG. 13 is a graph showing a variation in transmittance in percent (%) versus wavelengths in nanometers (nm) of a color conversion element including a red-QD and a color conversion element including a green-QD applicable to a display apparatus according to an embodiment.

Referring to FIG. 13, the color conversion element including the green-QD has a relatively high transmittance starting from approximately a wavelength corresponding to a green wavelength region, and the color conversion element including the red-QD has a relatively high transmittance starting from approximately a wavelength corresponding to a red wavelength region.

Figure 14:
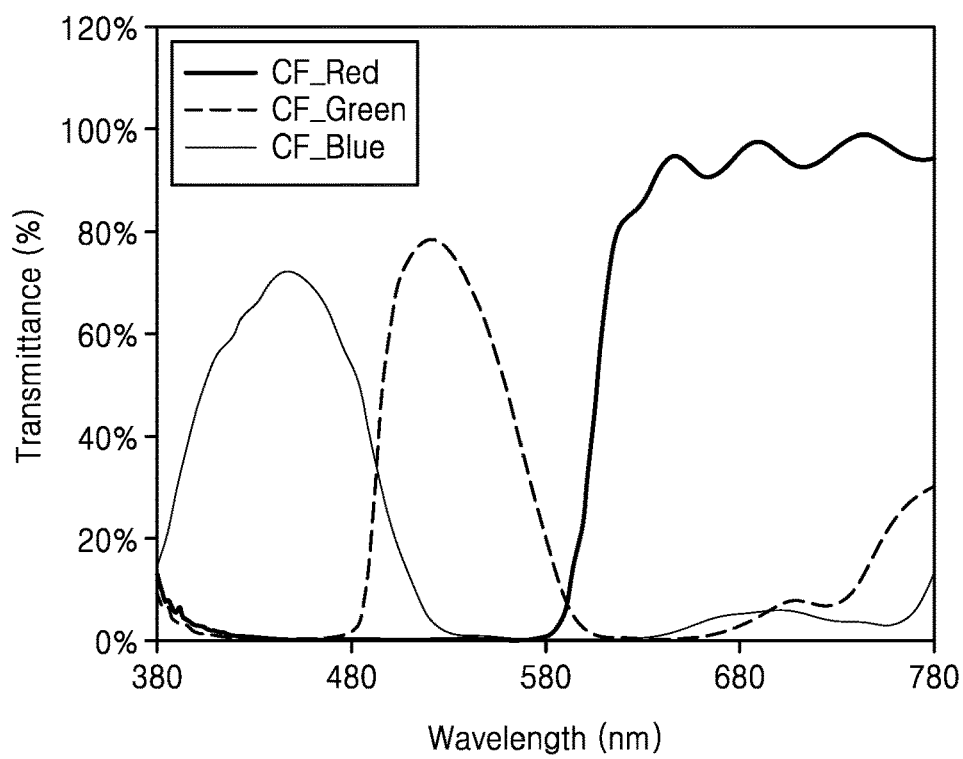
FIG. 14 is a graph showing a variation in transmittance (%) versus wavelength of an absorption-type color filter applicable to a display apparatus according to an embodiment.

FIG. 14 is a graph showing a variation in a transmittance in percent (%) versus a wavelength in nanometers (nm) of an absorption type color filter applicable to a display apparatus according to an embodiment. The graph of FIG. 14 shows a variation in a transmittance (%) versus a wavelength (nm) of each of an absorption type red-color filter, an absorption type green-color filter and an absorption type Blue-color filter. The absorption type red-color filter, the absorption type green-color filter and the absorption type blue-color filter may be respectively applied to, for example, the first color filter 30a, the second color filter 30b, and the third color filter 30c of FIG. 1.

Figure 15:
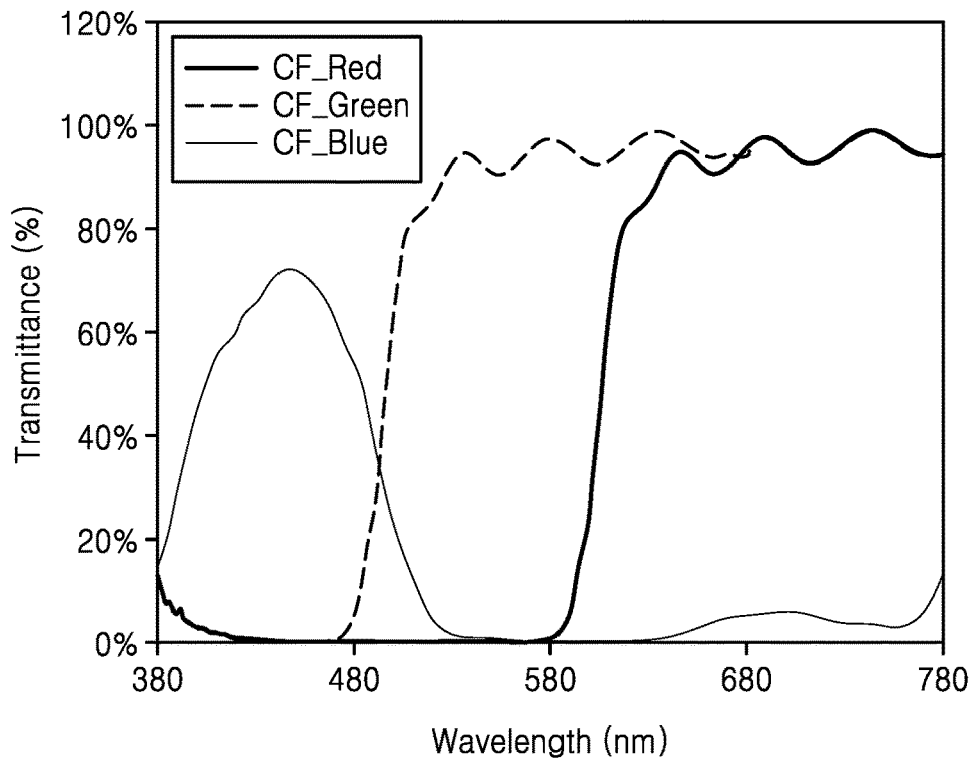
FIG. 15 is a graph showing a variation in transmittance (%) versus wavelength of a cut-off-type color filter applicable to a display apparatus according to an embodiment.

FIG. 15 is a graph showing a variation in a transmittance in percent (%) versus a wavelength in nanometers (nm) of a cut-off type color filter applicable to a display apparatus according to an embodiment. The graph of FIG. 15 shows a variation in a transmittance (%) versus a wavelength (nm) of each of a cut-off type red-color filter, a cut-off type green-color filter and a cut-off type blue-color filter. The cut-off type red-color filter, the cut-off type green-color filter and the cut-off type blue-color filter may be respectively applied to, for example, the first color filter 31a, the second color filter 31b and the third color filter 31c of FIG. 2.

Figure 16:
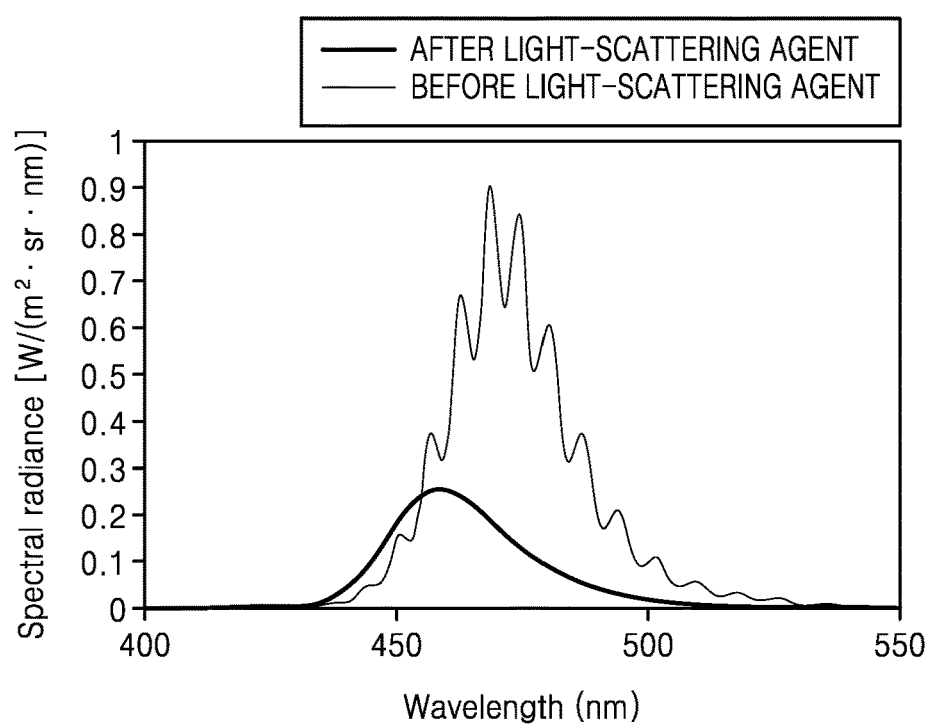
FIG. 16 is a graph showing a spectral radiance difference between when a light-scattering agent is applied to blue light and when the light-scattering agent is not applied to blue light.

FIG. 16 is a graph showing a spectral radiance difference between when a light-scattering agent is applied to blue light and when the light-scattering agent is not applied to the blue light. The spectral difference is expressed in watt per steradian per square metre per nanometre (W/(m$^2$·sr·nm)).

Referring to FIG. 16, when the light-scattering agent was not applied ("Before light-scattering agent"), light was not appropriately dispersed and thus a plurality of peaks occurred. When the light-scattering agent was applied ("After light-scattering agent"), light was appropriately dispersed and thus one relatively smoothly curved one peak occurred.

Figure 17:
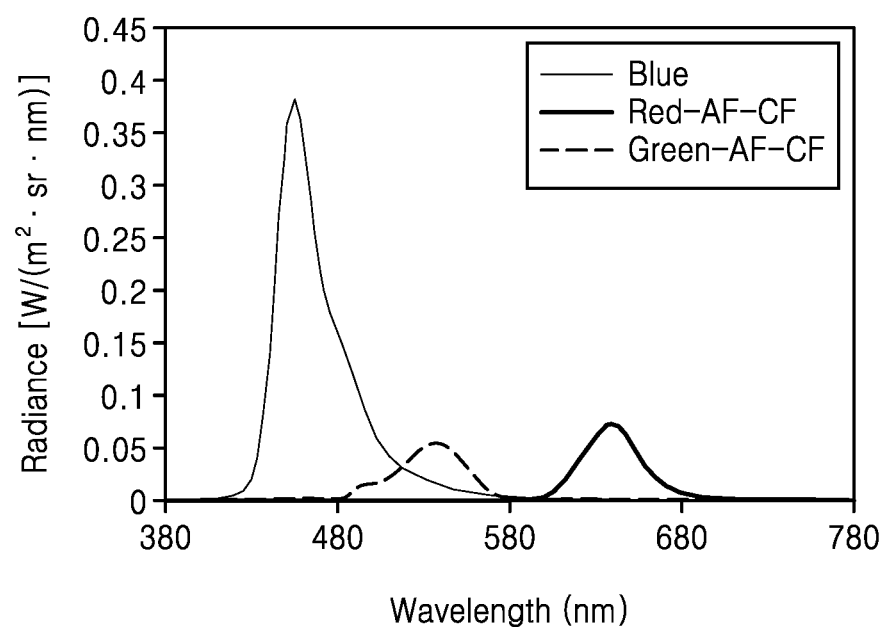
FIG. 17 is a graph showing an emission spectrum according to a wavelength of a display apparatus according to an embodiment.

FIG. 17 is a graph showing an emission spectrum according to a wavelength of a display apparatus according to an embodiment. The emission spectrum is expressed in watt per steradian per square metre (W·sr$^{-1}$·m$^{-2}$).

Referring to FIG. 17, a spectrum ("Red-AF-CF") of light generated from an OLED substrate (as a light source) after the light passed through a color conversion element including a red-QD corresponds to a red light region, a spectrum ("Green-AF-CF") of the light after the light passed through a color conversion element including a green-QD corresponds to a green light region, and a spectrum ("Blue") of light which has passed through a non-color-converting region of an organic material layer such as in a blue pixel region corresponds to a blue light region.

The display apparatuses according to one or more embodiment described above are applicable to various types of electronic devices. For example, the display apparatuses are applicable to relatively small-sized electronic devices such as portable devices or wearable devices, and medium and relatively large-sized electronic devices such as household appliances.

Although many matters have been described above in detail, it should be understood that they are not intended to restrict the scope of the present disclosure and are provided to give examples. For example, it would be apparent to those of ordinary skill in the art that various changes may be made in the structures of and relations among the OLED substrates, the encapsulation layers, the QD color control elements, the color filter layers and the display apparatuses described above with reference to FIGS. 1 to 10. In an embodiment, for example, a bottom-emission light-emitting device may be used as an OLED substrate instead of a top-emission light-emitting device shown in the figures, and various changes may be made in structures of a QD color control element and/or a color filter layer according to color of light emitted from the OLED substrate. Furthermore, structures according to embodiments or parts thereof are applicable to display apparatuses and other types of devices, e.g., lighting devices. Accordingly, the scope of the present disclosure should be determined not by the embodiments set forth herein but by the technical idea defined in the appended claims.

What is claimed is:

1. A display apparatus comprising:
   a plurality of sub-pixel regions at which color light is emitted to display an image, the plurality of sub-pixel regions including a first sub-pixel region, a second sub-pixel region, and a third sub-pixel region;
   an organic light-emitting device substrate which generates and emits a light, the organic light-emitting device substrate comprising a cyan organic light-emitting device substrate which emits cyan light; and
   in order from the organic light-emitting device substrate:
      a first inorganic material layer;
      an organic material layer comprising:
         a first color control element which corresponds to the first sub-pixel region, includes a first quantum dot converting a color of the emitted light from the organic light-emitting device substrate to a first color and emits light of the first color;
         a second color control element which corresponds to the second sub-pixel region, includes a second quantum dot converting the color of the emitted light from the organic light-emitting device substrate to a second color and emits light of the second color; and
         a third color control element which corresponds to the third sub-pixel region, and includes a third quantum dot converting the color of the emitted light from the organic light-emitting device substrate to a third color, or a light-scattering element maintaining the color of the emitted light from the organic light-emitting device substrate;
      a second inorganic material layer; and
      a color filter layer comprising:
         a first color filter corresponding to the first color control element,
         a second color filter corresponding to the second color control element, and
         a third color filter corresponding to the third color control element or the light-scattering element.

2. The display apparatus of claim 1, wherein each of the first quantum dot, the second quantum dot, and if the third quantum dot is present, the third quantum dot independently comprises a material selected from the group consisting of a Group II-VI-based semiconductor, a Group III-V-based semiconductor, a Group IV-VI-based semiconductor, and a Group IV-based semiconductor.

3. The display apparatus of claim 1, wherein each of the first quantum dot, the second quantum dot, and if the third quantum dot is present, the third quantum dot independently comprises a monolithic structure or a core-shell structure.

4. The display apparatus of claim 1, wherein the first color is red, the second color is green and the third color is blue.

5. The display apparatus of claim 1, wherein
   the first color filter is a first cut-off filter which selectively transmits light in a red light wavelength region or an absorption-type red color filter,
   the second color filter is a second cut-off filter which selectively transmits light in a green light wavelength region or an absorption-type green color filter, and
   the third color filter is a third cut-off filter which selectively transmits light in a blue light wavelength region or an absorption-type blue color filter.

6. The display apparatus of claim 1, wherein the organic material layer further comprises:
   a photocurable organic material; and
   a light-scattering agent.

7. The display apparatus of claim 1, wherein the organic material layer has a thickness of about 10 nanometers to about 10,000 nanometers.

8. The display apparatus of claim 1, wherein each of the first inorganic material layer and the second inorganic material layer independently comprises a material selected from the group consisting of a metal nitride, a metal oxide, a metal oxynitride, a metal carbide, and a combination thereof.

9. The display apparatus of claim 1, wherein each of the first inorganic material layer and the second inorganic material layer independently has a thickness of about 10 nanometers to about 5,000 nanometers.

10. The display apparatus of claim 1, wherein each of the first inorganic material layer and the second inorganic material layer independently comprises an insulating layer or a semiconductor layer; or has an encapsulation property.

11. The display apparatus of claim 1, further comprising a fourth sub-pixel region, producing a color other than colors of the first to third sub-pixel regions,
   wherein the organic material layer further comprises a light-scattering element, corresponding to the fourth sub-pixel region.

12. The display apparatus of claim 1, wherein the second inorganic material layer is further provided directly on the third color control element without another intervening layer.

* * * * *